(12) United States Patent
Sato et al.

(10) Patent No.: US 9,117,703 B2
(45) Date of Patent: Aug. 25, 2015

(54) LIQUID CRYSTAL DISPLAY DEVICE

(75) Inventors: Takeshi Sato, Kokubunji (JP); Hirotaka Imayama, Mobara (JP)

(73) Assignees: JAPAN DISPLAY INC., Tokyo (JP); PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 864 days.

(21) Appl. No.: 13/235,634

(22) Filed: Sep. 19, 2011

(65) Prior Publication Data

US 2012/0074415 A1 Mar. 29, 2012

(30) Foreign Application Priority Data

Sep. 24, 2010 (JP) .................................. 2010-213195

(51) Int. Cl.
*H01L 29/04* (2006.01)
*H01L 27/12* (2006.01)

(52) U.S. Cl.
CPC .............. *H01L 27/12* (2013.01); *H01L 27/124* (2013.01)

(58) Field of Classification Search
CPC ............... G02F 1/136286; G02F 1/133345; G02F 1/13439; G02F 1/134309; G02F 1/36213; G02F 1/1362; G02F 1/1333; G02F 2201/123; G02F 1/0045; G02F 1/133514; H01L 27/12; H01L 27/124; G09G 2300/0452; G09G 3/3607

USPC .................. 349/141–144, 43, 106, 108, 152; 257/59, 52

See application file for complete search history.

(56) References Cited

U.S. PATENT DOCUMENTS

| | | | |
|---|---|---|---|
| 2003/0071943 A1* | 4/2003 | Choo et al. ..................... 349/106 |
| 2006/0256270 A1* | 11/2006 | Nakayoshi et al. ........... 349/141 |
| 2007/0176950 A1* | 8/2007 | Brown Elliott et al. ...... 345/694 |
| 2009/0009671 A1 | 1/2009 | Wakabayashi |
| 2010/0053501 A1* | 3/2010 | Nakayoshi et al. ............. 349/63 |

FOREIGN PATENT DOCUMENTS

| | | |
|---|---|---|
| JP | 5-265045 | 10/1993 |
| JP | 2008-276172 | 11/2008 |

* cited by examiner

*Primary Examiner* — H Tsai
(74) *Attorney, Agent, or Firm* — Lowe Hauptman & Ham, LLP

(57) ABSTRACT

Provided is a liquid crystal display device, in which: the gate lines include a first gate line and a second gate line for respectively outputting the scanning signals at two different scanning timings for each of scanning lines; and a unit pixel for color display, constituted by three pixels corresponding to a red (R) pixel, a green (G) pixel, and a blue (B) pixel arranged side by side, is formed in a region surrounded by the first gate line, the second gate line, and the drain lines, and the three pixels corresponding to the red (R) pixel, the green (G) pixel, and the blue (B) pixel are arranged in matrix for the each unit pixel.

5 Claims, 6 Drawing Sheets

LIQUID CRYSTAL DISPLAY DEVICE

CROSS-REFERENCE TO RELATED APPLICATION

The present application claims priority from Japanese application JP 2010-213195 filed on Sep. 24, 2010, the content of which is hereby incorporated by reference into this application.

BACKGROUND OF THE INVENTION

1. Field of the Invention

The present invention relates to a liquid crystal display device, in particular, a liquid crystal display device including pixel electrodes and drain lines formed in the same layer.

2. Description of the Related Art

A liquid crystal display device called in-plane switching (IPS) or lateral electric field type has a configuration in which pixel electrodes and a common electrode that are provided so as to be opposed to each other through the intermediation of an insulating film are formed on the same flat substrate. In the IPS liquid crystal display device, an electric field having a component parallel to a main surface of the flat substrate is generated between the pixel electrodes and the common electrode so that liquid crystal molecules are driven by the thus generated electric field. With the configuration described above, the IPS liquid crystal display is known as being capable of performing display with a wide viewing angle. In particular, in a so-called C-top type IPS liquid crystal display device including a common electrode formed on the side closest to a liquid crystal layer, a transparent electrode having a plurality of slits formed therethrough is formed on the liquid crystal side of flat-plate like pixel electrodes made of a transparent conductive film through the intermediation of an insulating film. With the configuration described above, an electrode having a linear pattern (comb-like electrode) overlapping the flat-plate like pixel electrodes is formed.

As an example of the liquid crystal display device having the configuration described above, there is known a liquid crystal display device described in Japanese Patent Application Laid-open No. 2008-276172. In the liquid crystal display device described in Japanese Patent Application Laid-open No. 2008-276172, each of slits of a common electrode has a linear continuous portion between adjacent pixels. Thus, the liquid crystal display device, in which the continuous portions are symmetric with respect to a boundary of the pixels so as to reduce viewing-angle dependence, is disclosed.

Further, Japanese Patent Application Laid-open No. 5-265045 discloses a liquid crystal display device in which two gate lines are arranged for one line in a scanning direction, and one drain line is provided for each set of two pixels on each display line.

In the conventional liquid crystal display devices, a plurality of drain lines and a plurality of gate lines are formed on a glass substrate so as to cross each other. A video signal is input to the drain lines, whereas a scanning signal is input to the gate lines. A region surrounded by adjacent drain lines and adjacent gate lines is a pixel region. For each pixel region, a pixel electrode is formed.

The C-top type IPS liquid crystal display device is also known, which includes drain lines and pixel electrodes formed in the same layer. In the liquid crystal display device having the configuration described above, gate electrodes and gate lines are formed on a surface of a glass substrate. An insulating film functioning as a gate insulating film of a thin-film transistor is formed so as to cover the upper surface of the glass substrate. On a surface of the insulating film, the drain lines and the pixel electrodes are formed. The drain lines and the pixel electrodes are covered with an interlayer insulating film made of an inorganic material, which is formed so as to cover the upper surface of the substrate. A transparent conductive film serving as a common electrode is formed on a surface of the interlayer insulating film.

When the technology described in Japanese Patent Application Laid-open No. 2008-276172 is applied to the liquid crystal display device having the configuration described above, the drain lines and the common electrode overlap each other through the intermediation of the insulating film made of the inorganic material, having an extremely smaller thickness than that of the interlayer insulating film made of an organic material, between red (R), green (G), and blue (B) pixels. Therefore, liquid crystal is driven by the electric field between the drain lines and the common electrode to cause light leakage. As a result, there is a fear of lowered contrast. The light leakage from an overlapping region between the drain lines and the common electrode can be prevented by forming a shielding film such as a black matrix between the pixels. In this case, however, there is another fear in that an aperture ratio cannot be improved.

On the other hand, when the technology described in Japanese Patent Application Laid-open No. 5-265045 is applied to the liquid crystal display device having the configuration described above, a drain line DL can be formed for each set of two pixels PXL, as illustrated in FIG. 6. As a result, as illustrated in FIG. 7 corresponding to a sectional view taken along the line VII-VII of FIG. 6, a region in which the drain line DL and a common electrode CT overlap each other can be reduced for each set of two pixels. The formation of the shielding film such as a black matrix BM for each region in which the drain line DL and the common electrode CT overlap each other, specifically, for each set of two pixels, enables the prevention of the light leakage from the overlapping region. With the configuration described above, however, it is difficult to greatly improve the aperture ratio. Further, the pixels adjacent to each other without the intermediation of the light-shielding film and the pixels adjacent to each other through the intermediation of the light-shielding film are periodically arranged among the three pixels, that is, RGB pixels arranged so as to be adjacent to each other. As a result, there is a fear of occurrence of unevenness in display.

SUMMARY OF THE INVENTION

The present invention has been made in view of the problems described above, and therefore has an object to provide a technology for enabling the improvement of an aperture ratio of an IPS liquid crystal display device which includes drain lines and pixel electrodes formed in the same layer.

(1) In order to solve the above-mentioned problems, a liquid crystal display device according to the present invention includes: a plurality of drain lines to which a video signal is input; a plurality of gate lines formed so as to cross the plurality of drain lines, to which a scanning signal is input; and pixels including: pixel electrodes formed in the same layer as a layer of the plurality of drain lines; and thin-film transistors connected to the plurality of gate lines and the plurality of drain lines, for feeding the video signal to the pixel electrodes in synchronization with the scanning signal, in which: the pixels are arranged in matrix along a direction in which the plurality of drain lines and the plurality of gate lines extend; the plurality of gate lines include a first gate line and a second gate line for respectively outputting the scanning signals at two different scanning timings for each of scanning lines; and a unit pixel for color display, constituted by three pixels corresponding to a red (R) pixel, a green (G) pixel, and a blue (B) pixel arranged side by side, is formed in a region surrounded by the first gate line, the second gate line, and the plurality of drain lines, and the three pixels corresponding to the red (R) pixel, the green (G) pixel, and the blue (B) pixel are arranged in matrix for the each unit pixel.

(2) In order to solve the above-mentioned problems, in the liquid crystal display device according to item (1): the plurality of drain lines include: a first drain line connected to two of the pixels included in the unit pixel; a second drain line connected to two of the pixels included in the unit pixel on an odd-numbered one of the scanning lines and connected to one of the pixels included in the unit pixel and to one of the pixels included in an adjacent unit pixel on an even-numbered one of the scanning lines; and a third drain line connected to one of the pixels included in the unit pixel and to one of the pixels included in the adjacent unit pixel on the odd-numbered scanning line and connected to two of the pixels included in the unit pixel on the even-numbered scanning line; and the unit pixel constituted by the three pixels corresponding to the red (R) pixel, the green (G) pixel, and the blue (B) pixel arranged side by side is formed in each of a region surrounded by the first gate line, the second gate line, the first drain line, and the second drain line and a region surrounded by the first gate line, the second gate line, the second drain line, and the third drain line.

According to the present invention, the aperture ratio of the IPS liquid crystal display device which includes the drain lines and the pixel electrodes formed in the same layer can be further improved.

The other effects of the present invention become apparent from the description of the whole specification.

DETAILED DESCRIPTION OF THE INVENTION

Hereinafter, embodiments to which the present invention is applied are described with reference to the accompanying drawings. Note that, in the following description, the same components are denoted by the same reference symbols and repetitive description thereof is omitted.

First Embodiment

Overall Configuration

Figure 1:
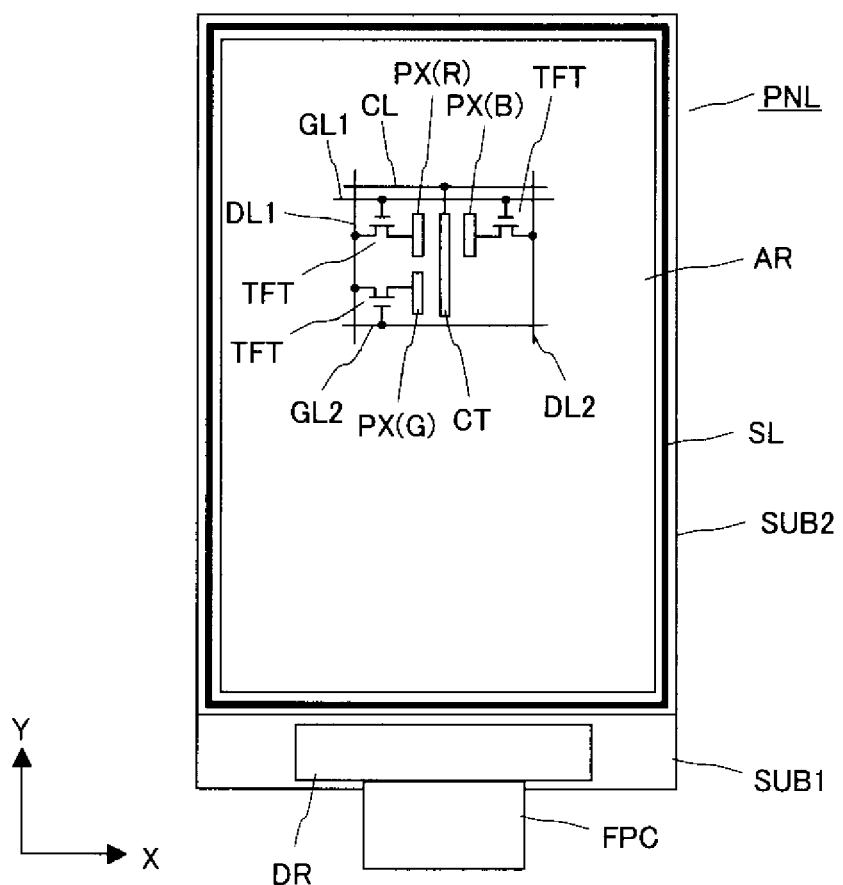
FIG. 1 is a diagram for illustrating an overall configuration of a liquid crystal display device according to a first embodiment of the present invention.

FIG. 1 is a diagram for illustrating an overall configuration of a liquid crystal display device according to a first embodiment of the present invention. The overall configuration of the liquid crystal display device according to the first embodiment is described below with reference to FIG. 1. The symbols "X" and "Y" illustrated in FIG. 1 indicate the X axis and the Y axis. In the following description, the case where red (R), green (G), and blue (B) pixels are arranged side by side in this order in each region surrounded by drain lines and gate lines is described. However, the order of arrangement of the pixels of the respective colors may be different. Further, a thin-film transistor TFT is an inverted-staggered thin-film transistor. By the application of a bias, the thin-film transistor is driven so as to interchange a drain electrode and a source electrode. In this specification, for convenience, an electrode connected to drain lines DL1 and DL2 is denoted as a drain electrode DT, whereas an electrode connected to a pixel electrode PX is denoted as a source electrode ST.

As illustrated in FIG. 1, the liquid crystal display device according to the first embodiment includes a liquid crystal display panel PNL. The liquid crystal display panel PNL includes a first substrate (TFT substrate) SUB1, a second substrate (counter substrate) SUB2, and a liquid crystal layer (not shown). On the first substrate SUB1, the pixel electrodes PX, the thin-film transistors TFT, and the like are formed. The second substrate SUB2 is provided so as to be opposed to the first substrate SUB1, and color filters of red (R), green (G), and blue (B) are formed on the second substrate SUB2. The liquid crystal layer is interposed between the first substrate SUB1 and the second substrate SUB2. The liquid crystal display panel PNL is combined with a backlight unit (backlight device) (not shown) corresponding to a light source of the liquid crystal display panel PNL to constitute the liquid crystal display device. The first substrate SUB1 and the second substrate SUB2 are fixed to each other by a sealing member SL applied in an annular form onto a peripheral region of the second substrate SUB2. Liquid crystal is also sealed between the first substrate SUB1 and the second substrate SUB2 by the sealing member SL. The second substrate SUB2 has a smaller area than that of the first substrate SUB1, and therefore a side portion of the first substrate SUB1 on the lower side of FIG. 1 is exposed. On the exposed side portion of the first substrate SUB1, a drive circuit DR including a semiconductor chip is mounted. The drive circuit DR drives each of the pixels arranged in a display region AR. For each of the first substrate SUB1 and the second substrate SUB2, for example, a known glass substrate is generally used as a base material. However, each of the first substrate SUB1 and the second substrate SUB2 is not limited to the glass substrate. Other insulating substrates made of quartz glass or a plastic (resin) may be used. Moreover, in the liquid crystal display device according to the first embodiment, the display region AR corresponds to a region in which display pixels (hereinafter, referred to simply as "pixels") are formed in the region in which the liquid crystal is sealed (hereinafter, referred to as the liquid-crystal sealed region). Therefore, in the liquid-crystal sealed region, a region in which the pixels are not formed and which does not relate to display is not included in the display region AR. In the following description, the liquid crystal display panel PNL alone is sometimes referred to as "liquid crystal display device".

In the liquid crystal display device according to the first embodiment, two scanning signal lines (gate lines) GL are formed for one scanning line in the display region AR of the surface of the first substrate SUB1 on the liquid crystal side. The gate lines GL extend in the X direction and are arranged side by side in the Y direction of FIG. 1. Scanning signals are fed from the drive circuit DR at different timings to the two gate lines GL on the same scanning line. In particular, as described below, the pixels of the scanning line are formed between the two gate lines GL on the same scanning line in the liquid crystal display device according to the present invention. Specifically, the scanning signal is fed to the pixel from the gate line arranged in proximity to the pixel.

In the display region AR, video signal lines (drain lines) DL1 to DL3 (see FIG. 2) are formed so as to extend in the Y direction and be arranged side by side in the X direction of FIG. 1. Video signals (gradation signals) are fed from the drive circuit DR to the drain lines DL1 to DL3. As described below, in the liquid crystal display device according to the first embodiment, the drain lines DL1 to DL3 arranged side by side in the X direction are formed for each unit pixel for color display, which is constituted by the pixels of three colors, that is, the R pixel, the G pixel, and the B pixel. With the configuration described above, a region surrounded by the drain lines DL1 to DL3 and the gate lines GL1 and GL2 becomes a region of the unit pixel for RGB color display. The unit pixels are arranged in matrix in the display region AR.

Ends of each of the drain lines DL1 to DL3 and the gate lines GL1 and GL2 extend beyond the sealing member SL. The ends of the drain lines DL1 to DL3 and the gate lines GL1 and GL2 are connected to the drive circuit DR for generating drive signals such as the video signal and the scanning signal based on an input signal input through a flexible printed board FPC from an external system. In the liquid crystal display device according to the first embodiment, however, the drive circuit DR is formed by the semiconductor chip so as to be mounted on the first substrate SUB1. Alternatively, however, a drive circuit of one or both of a video signal drive circuit for outputting the video signal and a scanning signal drive circuit for outputting the scanning signal may be mounted on the flexible printed board FPC by using a tape carrier method or a chip-on-film (COF) method so as to be connected to the first substrate SUB1.

As illustrated in FIG. 1, for example, each of the pixels forming the unit pixel includes the thin-film transistor TFT, the pixel electrode PX, and a common electrode CT. The thin-film transistor TFT is driven to be turned ON/OFF by the scanning signal from a corresponding one of the gate lines GL1 and GL2. The video signal is fed from a corresponding one of the drain lines DL1 and DL2 through the turned-ON thin-film transistor TFT. The common electrode CT is formed at least entirely over the display region AR. A common signal having a potential serving as a reference potential for a potential of the video signal is fed to the common electrode CT from one or both of the horizontal ends in the X direction (ends of the first substrate SUB1) through a common line CL.

Specifically, the unit pixel constituted by three pixels for color display, that is, the red (R) pixel, the green (G) pixel, and the blue (B) pixel, includes a pixel electrode PX (R) corresponding to R, a thin-film transistor TFT(R) for feeding the video signal to the pixel electrode PX (R), a pixel electrode PX (G) corresponding to G, a thin-film transistor TFT(G) for feeding the video signal to the pixel electrode PX (G), a pixel electrode PX (B) corresponding to B, and a thin-film transistor TFT (B) for feeding the video signal to the pixel electrode PX(B).

As illustrated in the equivalent circuit diagram A', gate electrodes of the thin-film transistors TFT(R) and TFT(B) are connected to the gate line GL1, whereas a gate electrode of the thin-film transistor TFT (G) is connected to the gate line GL2. Drain electrodes of the thin-film transistors TFT(R) and TFT(G) are connected to the drain line DL1, whereas a drain electrode of the thin-film transistor TFT(B) is connected to the drain line DL2. In the unit pixel having the configuration described above, for example, the scanning signals, each having a different ON period for the thin-film transistor TFT, are input to the gate lines GL1 and GL2. In synchronization with the scanning-line signal of the gate line GL2, the video signal corresponding to the pixel G is input to the drain line DL2. The video signals corresponding to the R pixel and the B pixel are input to the drain lines DL1 and DL2 in synchronization with the scanning-line signal of the gate line GL1. With the configuration described above, the video signals are fed to the three pixels by the two drain lines DL1 and DL2.

As described above, in the liquid crystal display device according to the first embodiment, the video signals are fed to the three pixels constituting the unit pixel by the two drain lines DL1 and DL2. At the same time, ON/OFF of each of the thin-film transistors TFT is controlled through the two gate lines GL1 and GL2. As a result, the number of the drain lines, which are arranged side by side in the direction in which the RGB pixels constituting the unit pixel are arranged, can be reduced.

In the liquid crystal display device according to the first embodiment, the common electrode CT is formed at least entirely over the display region AR. However, the formation of the common electrode CT is not limited thereto. For example, the common signal may be input to the common electrode CT which is formed independently for each pixel through the common line CL. Moreover, in the liquid crystal display device according to the first embodiment, an electric field having a component parallel to a main surface of the first substrate SUB1 is generated between the pixel electrodes PX and the common electrode CT. By the electric field, liquid crystal molecules are driven. The liquid crystal display device described above is known as one which enables display with a wide viewing angle. From the specificity of the application of the electric field to the liquid crystal, the above-mentioned liquid crystal display device is called an IPS or lateral electric field type liquid crystal display device. Further, the liquid crystal display device having the configuration described above performs display in a normally-black display mode in which a light transmittance is minimized (black display is performed) when the electric field is not applied to the liquid crystal and the light transmittance is improved by the application of the electric field.

[Configuration of Pixels]

Figure 2:
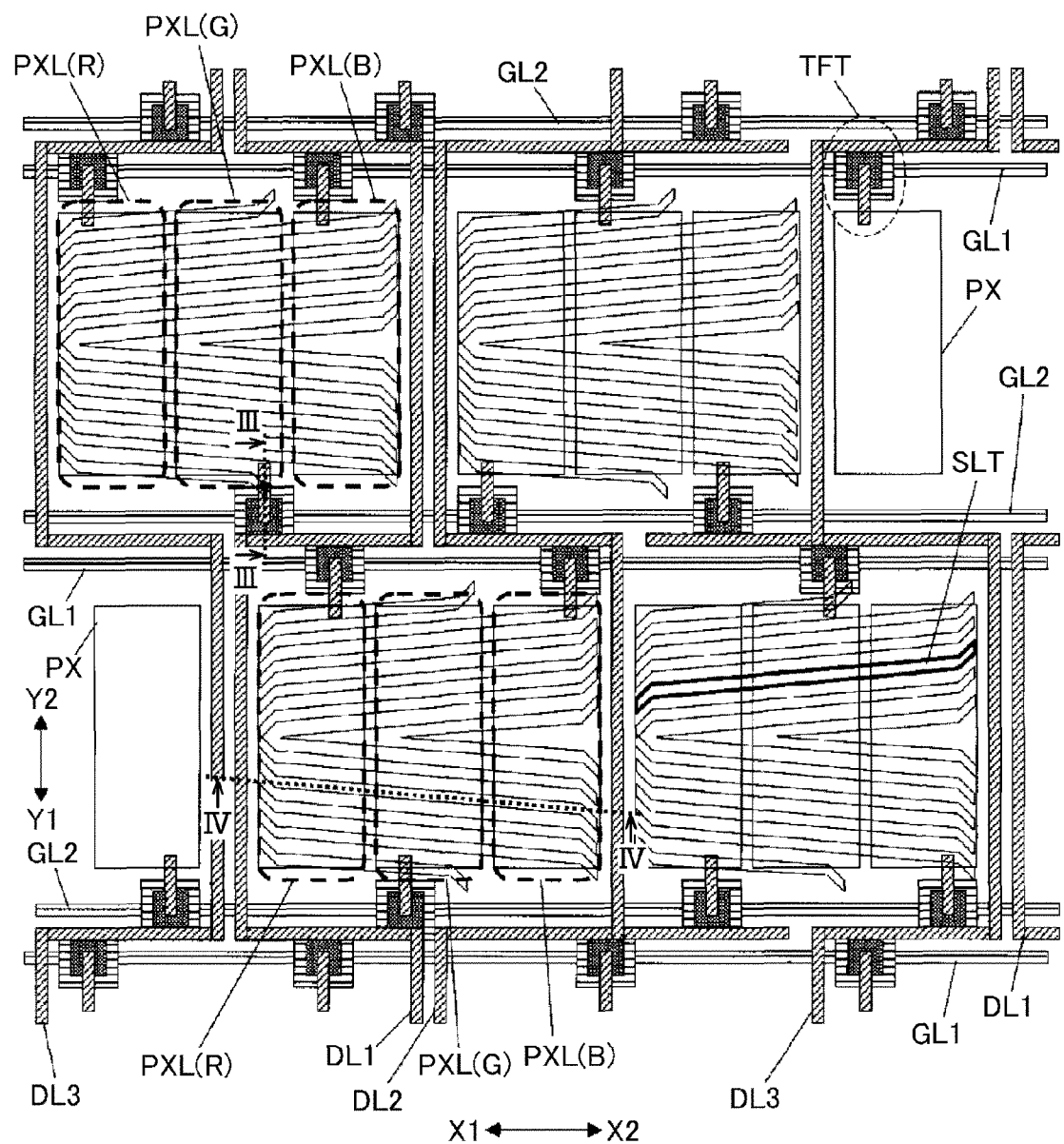
FIG. 2 is a plan view for illustrating a configuration of pixels of the liquid crystal display device according to the first embodiment of the present invention.

FIG. 2 is a plan view for illustrating a configuration of the pixels of the liquid crystal display device according to the first embodiment of the present invention, in particular, a plan view of the first substrate SUB1. In FIG. 2, the common electrode is not illustrated, and only slits SLT formed through the common electrode are illustrated. For the unit pixels illustrated in FIG. 2, the case where the unit pixels arranged in an upper row correspond to an odd-numbered scanning line and the unit pixels arranged in a lower row correspond to an even-numbered scanning line is described. However, the relation between the unit pixels and the scanning lines may be interchanged. Further, in the following description, each thin-film layer can be formed by a known photolithography technology. Therefore, the details of the method of forming the thin-film layer are herein omitted. Arrows Y1 and Y2 are parallel to the Y axis, whereas arrows X1 and X2 are parallel to the X axis. In the following description, when the orientation of the Y1 and Y2 directions and that of the X1 and X2 directions are not required to be specified, the directions are simply referred to as the Y direction and the X direction.

As illustrated in FIG. 2, the liquid crystal display device according to the first embodiment includes the two gate lines GL1 and GL2 which are provided so as to extend in the X direction and be arranged side by side in the Y direction. The gate lines GL1 and GL2 feed the scanning signals at different timings to the pixels on the same scanning line. A region between the two gate lines GL1 and GL2 becomes a region in which the pixels are formed in the direction in which the gate lines are arranged side by side, specifically, in the Y direction. In the region, the unit pixels are formed. Therefore, between the unit pixels adjacent to each other in the Y direction, two gate lines GL1 and GL2, that is, the gate line GL2 of the previous scanning line and the gate line GL1 of the scanning line for the pixels are formed in proximity to each other.

The liquid crystal display device according to the first embodiment also includes the three drain lines DL1 to DL3 which are provided so as to extend in the Y direction and be arranged side by side in the X direction. The drain lines DL1 to DL3 output the video signals in synchronization with the scanning signals for the two gate lines GL1 and GL2. Each of the drain lines DL1 to DL3 extends in the Y direction while being alternately bent in the X1 direction and the X2 direction for each scanning line. Therefore, a region surrounded by any two of the three drain lines DL1 to DL3 formed in the Y direction becomes a region in which the pixels are formed in the direction in which the drain lines are arranged side by side, specifically, in the X direction. In the region, the unit pixels are formed. The three drain lines DL1 to DL3 according to the first embodiment are sequentially arranged side by side in this order. In particular, in the region in which the drain line DL1 extends in the Y direction, the drain line DL1 is arranged in proximity to any one of the other two drain lines DL2 and DL3.

In the thus formed region in which the pixels are formed, the unit pixel for color display is formed. The unit pixel is constituted by a red (R) pixel PXL(R), a green (G) pixel PXL(G), and a blue (B) pixel PXL(B) arranged in proximity to each other, each being indicated by a dotted line. Between the pixels, the drain lines DL1 to DL3 are not formed. Specifically, three pixel electrodes PX, each having a rectangular shape (planar shape) with long sides being formed along the Y direction, are arranged consecutively side by side in the X direction between the drain lines DL1 to DL3.

Each pixel electrode PX overlaps the common electrode CT made from a transparent conductive film through an intermediation of an insulating film (not shown). A plurality of the slits SLT, each being an opening crossing the Y direction, are formed through the common electrode CT to form an electrode having a linear pattern (comb-like electrode). The plurality of slits SLT are formed so that an angle of formation (angle of inclination with respect to the Y direction) differs between two regions, that is, a Y1-side region and a Y2-side region of the unit pixel so that the angles of inclination of linear portions formed by the linear electrode pattern in the pixel are set different.

With the configuration described above, viewing-angle dependence is reduced. Further, the plurality of slits SLT are continuously formed over the three pixels constituting the unit pixel. The middle pixel of the three pixels is the green (G) one. With the configuration described above, an abnormal domain generated in the G pixel is reduced to improve brightness.

More specifically, in the unit pixel according to the first embodiment, after the transparent conductive film is formed in a planar manner in the region of the unit pixel, the plurality of slits SLT crossing the Y direction are formed in an opening region corresponding to a portion through which the backlight passes. With the configuration described above, the common electrode CT corresponding to the electrode having the linear pattern overlapping the three pixel electrodes is formed in the unit pixel. In the region of the single unit pixel, the two regions, that is, the Y1-side region and the Y2-side region are provided. The slits are formed so that the angle of formation of the slits SLT (angle of inclination with respect to the Y direction) differs between the two regions. In this manner, the angle of inclination of the linear portions formed by the linear electrode pattern in the unit pixel is set different.

In order to form the unit pixel having the configuration described above, the liquid crystal display device according to the first embodiment includes the three drain lines DL1 to DL3 respectively connected in different manners to the three pixels PXL(R), PXL(G), and PXL (B) included in the unit pixel, and the two gate lines GL1 and GL2. Moreover, in order to prevent the drain lines DL1 to DL3, the drain electrode DT, the source electrode, and the pixel electrodes PX(R), PX(G), and PX(B), which are formed in the same layer, from crossing each other, the unit pixels arranged on the odd-numbered scanning line (scanning row) are shifted by a ½ pitch in the X direction from the unit pixels arranged in the even-numbered scanning line.

Hereinafter, the configuration of the drain lines DL1 to DL3 and the gate lines GL1 and GL2, and the configuration of the three pixels PXL (R), PXL (G), and PXL (B) forming the unit pixel are described in detail with reference to FIG. 2.

As described above, in the liquid crystal display device according to the first embodiment, one or two of the drain lines DL1 to DL3 arranged side by side in the X direction and the two gate lines GL1 and GL2 arranged side by side in the Y direction are formed between the adjacent unit pixels for color display. In the liquid crystal display device according to the first embodiment, the second gate line GL1 formed on the Y2 side (upper side of FIG. 2) of the unit pixel and the first gate line GL2 formed on the Y1 side (lower side of FIG. 2) of the unit pixel correspond to the unit pixels (RGB pixels) formed on one scanning line. Specifically, in the present invention, the two gate lines GL1 and GL2 arranged side by side in the Y direction between the adjacent unit pixels for color display are connected to the thin-film transistors TFT of the pixels of the unit pixels (RGB pixels) which are close to the gate lines.

On the other hand, each of the drain lines DL1 to DL3 includes a first extending portion and a second extending portion. The first extending portion extends in the Y direction along the unit pixel, whereas the second extending portion extends in the X direction along the unit pixel. The second extending portion is formed between the two gate lines GL1 and GL2 which are provided so as to be adjacent to each other between the unit pixels. With the configuration described above, for example, in the case of the two drain lines DL1 and DL2 which are in proximity to each other between the unit pixels on the odd-numbered scanning line, the first extending portions of the drain lines DL1 and DL2 extend in the Y1 direction between the unit pixels. Thereafter, between the odd-numbered scanning line and the even-numbered scanning line, the first extending portion of the drain line DL1 is connected to the second extending portion thereof so as to extend in the X1 direction. On the other hand, the first extending portion of the drain line DL2 is connected to the second extending portion thereof so as to extend in the X2 direction. The liquid crystal display device according to the first embodiment has the configuration in which the positions of the unit pixels formed on the odd-numbered scanning line are shifted in the X direction from those of the unit pixels formed on the even-numbered scanning line. Therefore, the drain lines DL1 and DL2, which are formed in the same layer, can be formed in the same linear pattern without causing the second extending portion of the drain line DL1 and the second extending portion of the drain line DL2 to cross each other. In this manner, a distance between the pixels formed on the odd-numbered scanning line and the even-numbered scanning line can be reduced. As a result, an aperture ratio of the unit pixel can be improved, thereby enabling the improvement of contrast of the liquid crystal display panel PNL.

The second extending portion of the drain line DL1, which extends in the X1 direction, is connected to the first extending portion thereof on the even-numbered scanning line, which in turn extends in the Y1 direction along with the first extending portion of the drain line DL3 which is in proximity to the drain line DL1. Thereafter, the first extending portion of the drain line DL1 is connected to the second extending portion thereof which extends in the X2 direction. On the other hand, the second extending portion of the drain line DL2, which extends in the X2 direction, is connected to the first extending portion on the even-numbered scanning line so as to extend in the Y1 direction. Thereafter, the first extending portion of the drain line DL2 is connected to the second extending portion thereof so as to extend in the X1 direction. With the configuration described above, each of the drain lines DL1 to DL3 extends in the Y direction while being bent alternately in the X1 direction and the X2 direction for each scanning line.

Moreover, with the configuration described above, the thin-film transistor TFT having a portion extending from the second extending portion of each of the drain lines DL as the drain electrode DT can be formed on the X direction-side of each pixel. At the same time, in the configuration described above, the source electrode ST of the thin-film transistor, which is formed in the same layer and in the same fabrication step as those of the drain lines DL, does not cross the drain lines DL.

The drain line (first drain line) DL1 among the drain lines DL1 to DL3 according to the first embodiment in the configuration described above is a drain line connected to the thin-film transistors TFT of two of the pixels included in the single unit pixel on any of the odd-numbered scanning lines and the even-numbered scanning lines. The drain line (second drain line) DL2 is a drain line connected to the thin-film transistors TFT of two of the pixels included in the single unit pixel on the odd-numbered scanning line and connected to the thin-film transistor TFT of one of the pixels included in the single unit pixel on the even-numbered scanning line. The drain line (third drain line) DL3 is a drain line connected to the thin-film transistor TFT of one of the pixels included in the single unit pixel on the odd-numbered scanning line and connected to the thin-film transistors TFT of two of the pixels included in the single unit pixel on the even-numbered scanning line.

For realizing the configuration described above, the drain line DL1 is arranged together with any one of the other drain lines, that is, the drain lines DL2 and DL3 in the region between the unit pixels adjacent to each other in the X direction on any of the odd-numbered scanning line and the even-numbered scanning line. Specifically, on the odd-numbered scanning line, the drain line DL1 is formed together with the drain line DL2 between the adjacent unit pixels. On the other hand, on the even-numbered scanning line, the drain line DL1 is formed together with the drain line DL3 between the adjacent unit pixels. The drain line DL2 is formed together with the drain line DL1 corresponding to another one of the drain lines DL between the adjacent unit pixels on the odd-numbered scanning line. The drain line DL2 is formed alone between the adjacent unit pixels on the even-numbered scanning line. Further, the drain line DL3 is formed alone between the adjacent unit pixels on the odd-numbered scanning line and is formed together with the drain line DL1 corresponding to another drain line DL between the adjacent unit pixels on the even-numbered scanning line.

[Configuration of Thin-Film Transistor]

Figure 3:
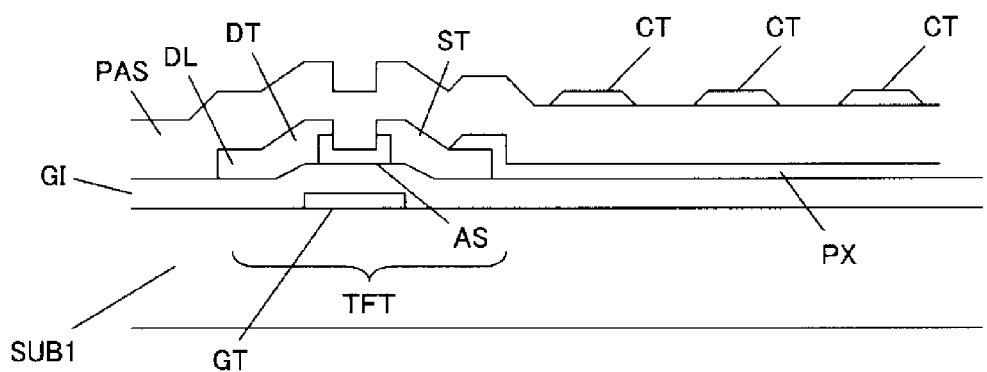
FIG. 3 is a sectional view taken along the line III-III of FIG. 2, for illustrating a specific configuration of a thin-film transistor according to the first embodiment.

FIG. 3 is a sectional view taken along the line III-III of FIG. 2 and is a sectional view of a region where the thin-film transistor is formed according to the first embodiment. The illustration of an orientation film formed on the upper surface of the first substrate SUB1 so as to cover the upper surface of the common electrode CT is omitted. The illustration of the liquid crystal layer and the second substrate which is provided so as to be opposed to the first substrate through an intermediation of the liquid crystal layer is also omitted.

As illustrated in FIG. 3, in the region where the thin-film transistor TFT is formed according to the first embodiment, a portion of the gate line GL formed on the upper surface of the first substrate SUB1 is extended in the Y1 and Y2 directions of FIG. 2 to form the gate electrode GT. On the gate line GL and the gate electrode GT, an insulating film GI is formed on the entire surface of the first substrate SUB1 so as to cover the gate line GL and the gate electrode GT. The insulating film GI functions as a gate insulating film of the thin-film transistor TFT in a semiconductor region, that is, the region where the thin-film transistor TFT is formed. Therefore, a thickness of the insulating film GI is set according to the function of the insulating film GI.

A semiconductor layer AS made of amorphous silicon is formed on a portion of the upper surface of the insulating film GI, which overlaps the gate electrode GT. The semiconductor layer AS is a semiconductor layer of the thin-film transistor TFT. A material of the semiconductor layer AS is not limited to amorphous silicon and may also be low-temperature polysilicon or microcrystalline silicon.

The drain line DL is formed on a surface of the insulating film GI. An end of the drain electrode DT extends from the drain line DL to the upper surface of the semiconductor layer AS so as to overlap the semiconductor layer AS. The source electrode ST which is formed simultaneously with the formation of the drain line DL and the drain electrode DT has one end opposed to the drain electrode DT on the semiconductor layer AS and the other end present on the semiconductor layer AS, which extends to the pixel electrode PX.

On the insulating film GI, the flat plate-like pixel electrode PX made of a transparent conductive material such as, for example, ITO is formed. The pixel electrode PX is formed in a step subsequent to a step of forming the drain line DT (including the drain line DL) and the source electrode ST. In the fabrication step, a part of a Y1-side end (end on the side closer to the thin-film transistor TFT) of the pixel electrode PX, which is illustrated in FIG. 2, is formed so as to overlap an upper surface of the other end of the source electrode ST. In this manner, the source electrode ST and the pixel electrode PX are electrically connected to each other.

On the drain electrode DT, the source electrode ST, and the pixel electrode PX, specifically, on the surface of the first substrate SUB1, a known protective film PAS made from an insulating film covering the thin-film transistor TFT is formed. The protective film PAS is provided so as to avoid a direct contact between the thin-film transistor TFT and the liquid crystal (not shown). The protective film PAS is formed so as to extend over the entire surface of the first substrate SUB1, which is on the liquid crystal side, that is, to a side edge portion of the entire surface of the first substrate SUB1.

The common electrode CT is formed on an upper surface of the protective film PAS. The protective film PAS formed between the common electrode CT and the pixel electrode PX also functions as a dielectric film of a storage capacitor. The common electrode CT according to the first embodiment is formed as follows. After a transparent conductive film made of, for example, ITO is formed in a planar manner in the display region AR, the plurality of slits SLT crossing the Y direction are formed in a portion of the unit pixel, which corresponds to a region through which the backlight passes. With the slits SLT, the electrode having the linear pattern (comb-like electrode) overlapping the pixel electrode PX is formed. On the common electrode CT, the orientation film (not shown) is formed.

[Specific Configuration of the Unit Pixel]

Figure 4:
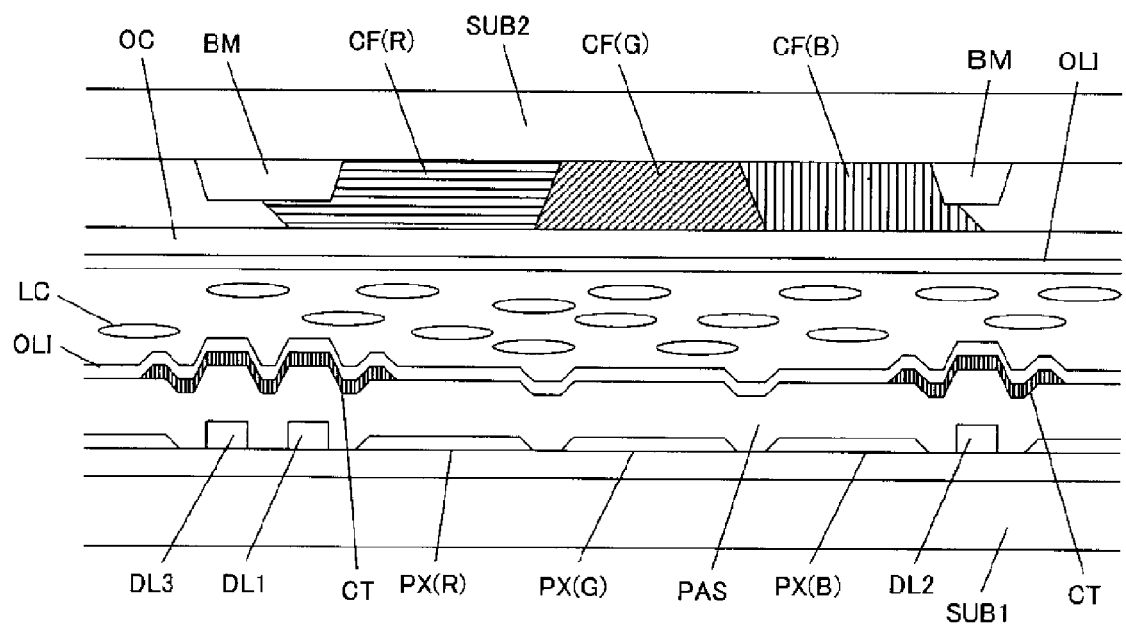
FIG. 4 is a sectional view taken along the line IV-IV of FIG. 2, for illustrating a specific configuration of a region of a unit pixel according to the first embodiment.

FIG. 4 is a sectional view taken along the line IV-IV of FIG. 2, for illustrating a specific configuration of the region of the unit pixel according to the first embodiment. The illustration of polarizer films formed on a back surface of the liquid crystal display panel PNL (lower surface of the first substrate illustrated in FIG. 4) and a front surface of the liquid crystal display panel PNL (upper surface of the second substrate illustrated in FIG. 4) is omitted in FIG. 4.

As illustrated in FIG. 4, in the region where the pixels PXL are formed in the liquid crystal display device according to the present invention, the insulating film GI is formed on the surface (surface on the liquid crystal side; surface opposed to the second substrate) of the first substrate SUB1. The drain lines DL1 to DL3 and the pixel electrodes PX(R), PX(G), and PX (B) are formed in the same layer on the upper surface of the insulating film GI (surface on the liquid crystal layer LC side). As described above, the RGB pixels are formed in proximity to each other. Therefore, between the drain lines DL1 and DL2 which are adjacent to each other through an intermediation of the unit pixels therebetween, the pixel electrode PX (R) constituting the R pixel PXL (R), the pixel electrode PX (G) constituting the G pixel PXL (G), and the pixel electrode PX (B) constituting the B pixel PXL (B) are formed in this order in proximity to each other. Specifically, between the three pixel electrodes PX(R), PX(G), and PX(B) forming the single unit pixel, the thin conductive film containing the drain lines DL1 to DL3 is not formed in the same layer.

The drain line DL1 is formed on the left of FIG. 4 of the pixel electrode PX (R), whereas the drain line DL2 is formed on a on the right of FIG. 4 of the pixel electrode PX (B). The protective film PS is formed on the pixel electrodes PX (R), PX (G), and PX (B) and the drain lines DL1 to DL3 so as to cover the entire surface of the first substrate SUB1. The common electrode CT is formed on the protective film PAS. FIG. 4 is a sectional view taken along the direction in which the slits SLT extend, that is, the direction of the openings formed through the thin conductive film forming the common electrode CT. Therefore, the common electrode CT is formed only on the regions overlapping the drain lines DL1 to DL3. On the common electrode CT, an orientation film OLI is formed so as to cover the entire surface of the first substrate SUB1.

On the other hand, on the surface (surface on the liquid crystal side; the surface opposed to the first substrate) of the second substrate SUB2 which is provided so as to be opposed to the first substrate SUB1 through an intermediation of the liquid crystal layer LC, a black matrix BM corresponding to a light-shielding film for shielding light from the regions of the surface, which correspond to the positions at which the drain lines DL1 to DL3 are formed, is formed. In the liquid crystal display device according to the first embodiment, a region in which the two drain lines DL1 and DL3 are arranged side by side between the adjacent unit pixels and a region in which the single drain line DL2 is arranged between the adjacent unit pixels are alternately formed. Therefore, in terms of a horizontal width of the black matrix BM, a portion of the black matrix BM having a large width and a portion of the black matrix BM having a small width are arranged alternately. In the liquid crystal display device according to the first embodiment, the black matrix BM is not provided between the three pixel electrodes PX adjacent to each other in the unit pixel. With the configuration described above, the aperture ratio of the unit pixel is improved to enable the improvement of the contrast of the liquid crystal display panel PNL.

On the black matrix BM, a red (R) color filter CF(R), a green (G) color filter CF(G), and a blue (B) color filter CF (B) are formed so as to be adjacent to each other. The color filters CF(R), CF(G), and CF(B) are respectively formed at the positions corresponding to the three pixel electrodes PX(R), PX(G), and PX (B) respectively forming the RGB pixels PXL(R), PXL(G), and PXL(B). Each of the two color filters CF(R) and CF(B) adjacent to the black matrix BM is formed so that its end overlaps a surface (surface on the liquid crystal side) of the black matrix BM. The surface of the black matrix BM is covered with the end of each of the color filters CF(R) and CF(B) and the end of the color filter CF (not shown) adjacent to the corresponding color filter through an intermediation of the black matrix BM. An overcoat layer OC is formed on the color filters CF (on the liquid crystal side) so as to cover the entire surface of the second substrate SUB2. By the overcoat layer, unevenness of the surface of the second substrate SUB2, which is generated by the formation of the color filters CF, is leveled. On the overcoat layer OC, another orientation film OLI is formed so as to cover the second substrate SUB2.

The RGB pixels PXL(R), PXL(G), and PXL(B) are formed in the above-mentioned configuration so that an image is displayed according to the electric field generated between the pixel electrodes PX(R), PX(G), and PX(B) corresponding to RGB and the common electrode CT.

As described above, the liquid crystal display device according to the first embodiment includes the gate lines GL1 and GL2 and the drain lines DL1 to DL3. In the region surrounded by the gate lines GL1 and GL2 and the drain lines DL1 and DL2 or the region surrounded by the gate lines GL1 and GL2 and the drain lines DL2 and DL3, the unit pixel for color display constituted by the three pixels, that is, the red (R) pixel, the green (G) pixel, and the blue (B) pixel arranged side by side is formed. Thus, the number of drain lines can be reduced. Therefore, a ratio of a wiring region to the display region can be reduced. As a result, the aperture ratio of each of the pixels can be improved. Further, the region of the black matrix formed so as to overlap the drain lines can also be reduced. Therefore, the aperture ratio of each of the pixels can be further improved. As a result, the contrast of the liquid crystal display device can be greatly improved. Further, the RGB pixels can be formed in the display region for each unit pixel constituted by the RGB pixels. Therefore, the particular effect of preventing unevenness in display due to the arrangement of the pixels from being generated can be obtained.

Second Embodiment

Figure 5:
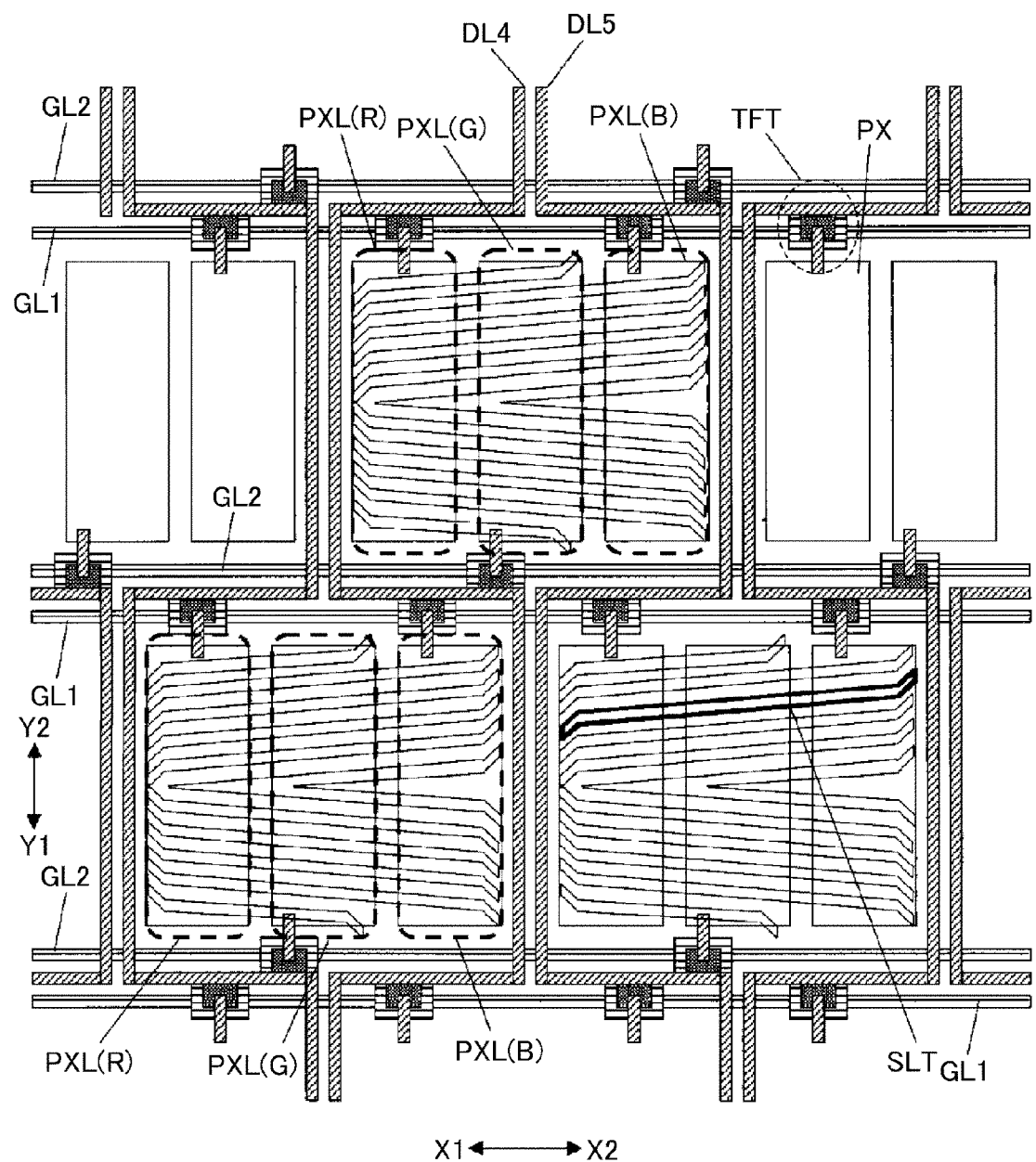
FIG. 5 is a plan view for illustrating a configuration of pixels of a liquid crystal display device according to a second embodiment of the present invention.
Figure 6:
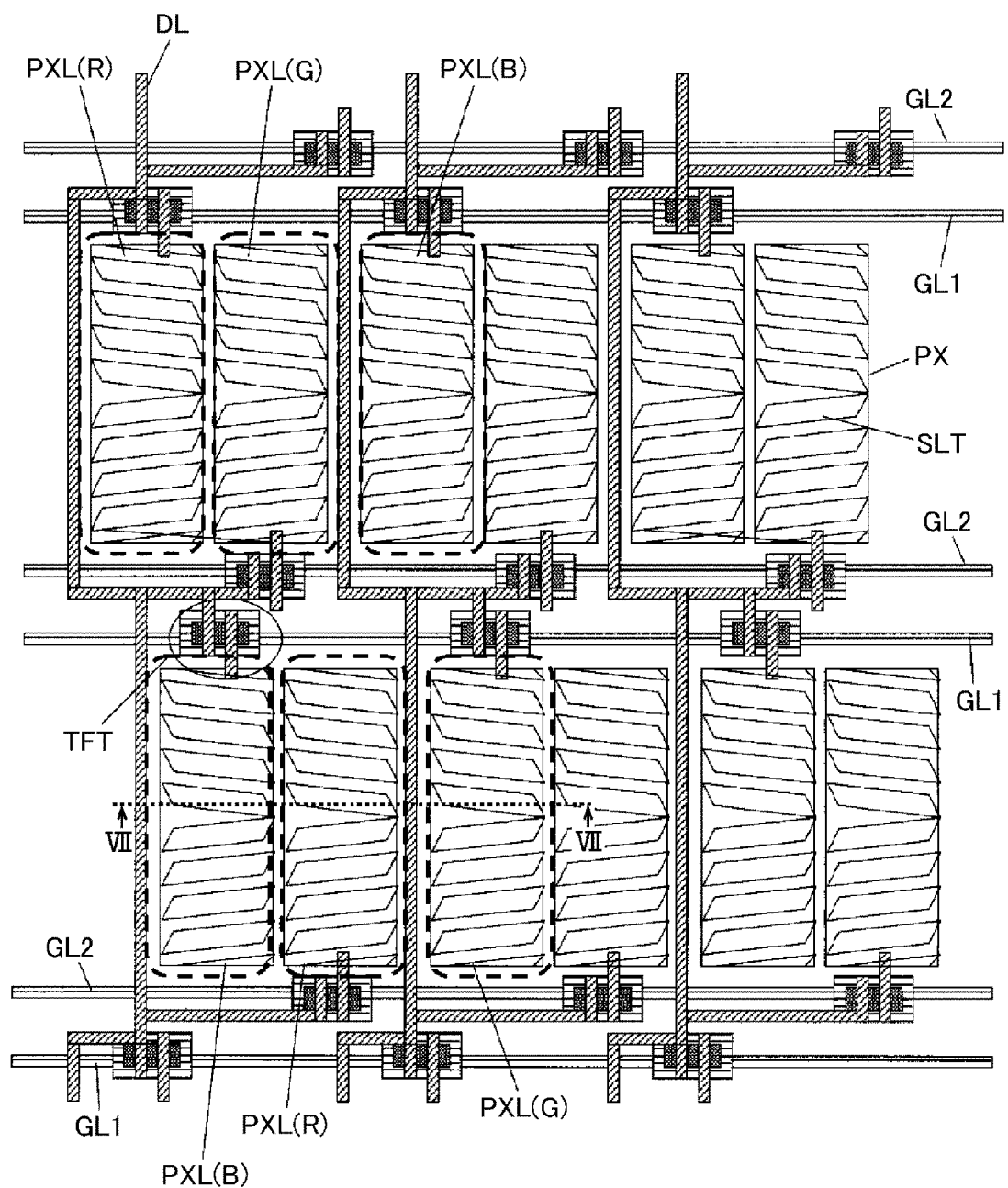
FIG. 6 is a plan view for illustrating a configuration of pixels of a conventional liquid crystal display device.
Figure 7:
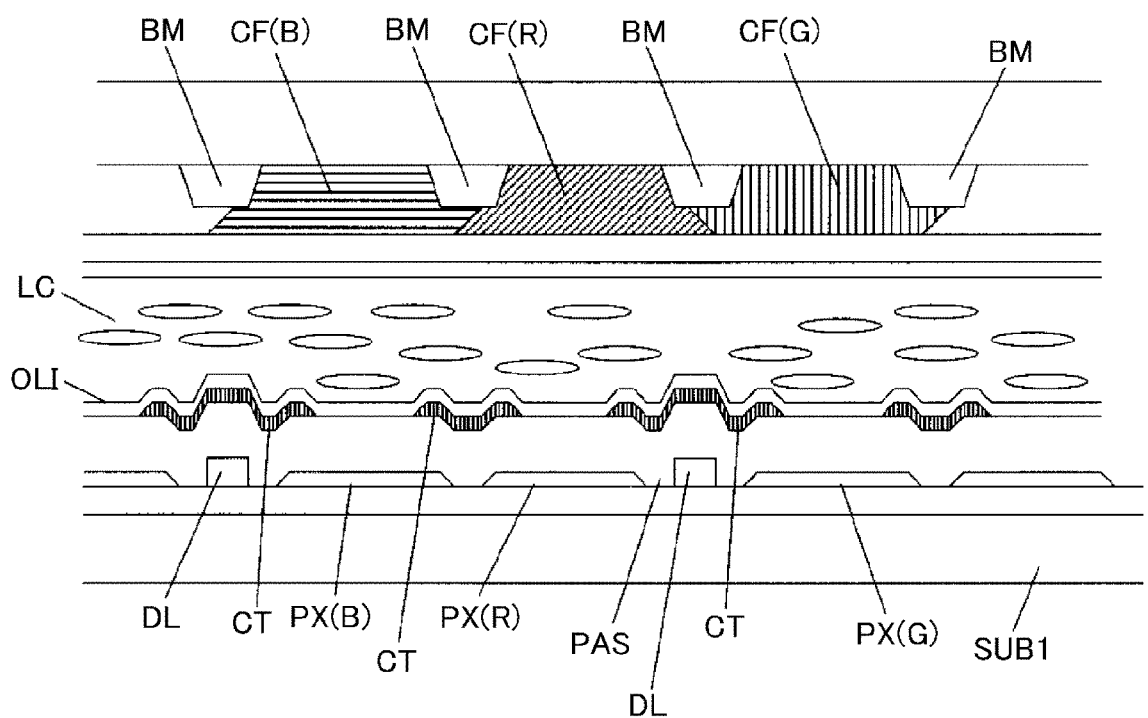
FIG. 7 is a sectional view taken along the line VII-VII of FIG. 6.

FIG. 5 is a plan view for illustrating a configuration of the pixels of a liquid crystal display device according to a second embodiment of the present invention, in particular, for illustrating the first substrate SUB1. The configuration illustrated in FIG. 2 is the same as that of the first embodiment except for a configuration of drain lines DL4 and DL5 and the order of the thin-film transistors connected to the drain lines DL4 and DL5. Therefore, in the following description, the drain lines DL4 and DL5 are described in detail.

As illustrated in FIG. 5, even in the liquid crystal display device according to the second embodiment, each of the drain lines DL4 (fourth drain line) and DL5 (fifth drain line) extends in the Y direction while being alternately bent in the X1 direction and the X2 direction for each scanning line. A portion of the drain line DL4 and a portion of the drain line DL5, which extend in the Y direction, are arranged in proximity to each other. Therefore, a region surrounded by the gate lines GL1 and GL2 and the drain lines DL4 and DL5 becomes a region in which the pixels are formed. In the thus formed region, the unit pixel for color display is formed. The unit pixel is constituted by the red (R) pixel PXL (R), the green (G) pixel PXL (G), and the blue (B) pixel PXL (B) arranged in proximity to each other, each being indicated by a dotted line. Between the pixels, the drain lines DL4 and DL5 are not formed.

Moreover, in order to prevent the drain lines DL4 and DL5, the drain electrode DT, the source electrode, and the pixel electrodes PX (R), PX (G), and PX (B), which are formed in the same layer, from crossing each other, the unit pixels arranged on the odd-numbered scanning line (scanning row) are shifted by a ½ pitch in the X direction from the unit pixels arranged in the even-numbered scanning line.

Hereinafter, the configuration of the drain lines DL4 and DL5 and the gate lines GL1 and GL2, and the configuration of the three pixels PXL (R), PXL (G), and PXL (B) forming the unit pixel are described in detail with reference to FIG. 5.

Each of the drain lines DL4 and DL5 according to the second embodiment also includes a first extending portion and a second extending portion. The first extending portion extends in the Y direction along the unit pixel, whereas the second extending portion extends in the X direction along the unit pixel. The second extending portion is formed between the two gate lines GL1 and GL2 which are provided so as to be adjacent to each other between the unit pixels. With the configuration described above, the first extending portions of the two drain lines DL4 and DL5 which are arranged in proximity to each other between the adjacent unit pixels extend in the Y1 direction. Thereafter, between the odd-numbered scanning line and the even-numbered scanning line, the first extending portion of the drain line DL4 is connected to the second extending portion thereof so as to extend in the X1 direction. On the other hand, the first extending portion of the drain line DL5 is connected to the second extending portion thereof so as to extend in the X2 direction. The liquid crystal display device according to the second embodiment has the configuration in which the positions of the unit pixels formed on the odd-numbered scanning line are shifted in the X direction from those of the unit pixels formed on the even-numbered scanning line. Therefore, the drain lines DL4 and DL5, which are formed in the same layer, can be formed in the same linear pattern without causing the second extending portion of the drain line DL4 and the second extending portion of the drain line DL5 to cross each other. In this manner, a distance between the pixels formed on the odd-numbered scanning line and the even-numbered scanning line can be reduced.

The second extending portion of the drain line DL4, which extends in the X1 direction, is connected to the first extending portion on the next scanning line, which in turn extends in the Y1 direction along with the first extending portion of the drain line DL5 of the adjacent pixel. Thereafter, the first extending portion of the drain line DL4 is connected to the second extending portion thereof which extends in the X2 direction.

On the other hand, the second extending portion of the drain line DL5, which extends in the X2 direction, is connected to the first extending portion thereof on the next scanning line so as to extend in the Y1 direction. Thereafter, the first extending portion of the drain line DL4 is connected to the second extending portion thereof so as to extend in the X1 direction. With the configuration described above, each of the drain lines DL4 and DL5 extends in the Y direction while being bent alternately in the X1 direction and the X2 direction for each scanning line.

The drain line DL4 according to the second embodiment is connected to the thin-film transistors TFT of two of the pixels in the same unit pixel on the odd-numbered scanning line and connected to the thin-film transistor TFT of one of the pixels in the same unit pixel on the even-numbered scanning line. The drain line DL5 is connected to the thin-film transistor of one of the pixels in the same unit pixel on the odd-numbered scanning line and connected to the thin-film transistors TFT of two of the pixels in the same unit pixel on the even-numbered scanning line.

As described above, even in the liquid crystal display device according to the second embodiment, the unit pixel for color display constituted by the three pixels, that is, red (R), green (G), and blue (B) pixels arranged side by side is formed in the region surrounded by the gate lines GL1 and GL2 and the drain lines DL4 and DL5. Therefore, the number of drain lines can be reduced. Accordingly, the same effects as those of the first embodiment described above can be obtained.

The invention made by the inventor of the present invention is described above specifically based on the embodiments, but the present invention is not limited to the embodiments described above, and various modifications can be made thereto without departing from the gist thereof.

What is claimed is:

1. A liquid crystal display device, comprising:
a plurality of drain lines to which a video signal is input;
a plurality of gate lines formed so as to cross the plurality of drain lines, to which a scanning signal is input; and
pixels comprising:
   pixel electrodes formed in the same layer as a layer of the plurality of drain lines; and
   thin-film transistors connected to the plurality of gate lines and the plurality of drain lines, for feeding the video signal to the pixel electrodes in synchronization with the scanning signal,
wherein the pixels are arranged in matrix along a direction in which the plurality of drain lines and the plurality of gate lines extend,
wherein the plurality of drain lines include a first drain line and a second drain line for respectively feeding the video signals,
wherein the plurality of gate lines include a first gate line and a second gate line for respectively outputting the scanning signals at two different scanning timings for each of scanning lines,
wherein a first unit pixel for color display, is constituted by three pixels corresponding to a red pixel, a green pixel, and a blue pixel arranged side by side, and is formed in a region surrounded by the first gate line, the second gate line, the first drain line and the second drain line, and the three pixels corresponding to the red pixel, the green pixel, and the blue pixel are arranged for each first unit pixel,
wherein the first gate line is connected to the red pixel and the blue pixel of the first unit pixel, the second gate line is connected to the green pixel of the first unit pixel, the first drain line is connected to the red pixel and the green pixel of the first unit pixel, and the second drain line is connected to the blue pixel of the unit pixel, and wherein the first gate line is connected to one pixel of a second unit pixel adjacent to the first unit pixel, and the second gate line is connected to two pixels of the second unit pixel different from the one pixel of the second unit pixel.

2. The liquid crystal display device according to claim 1, wherein the first drain line and the second drain line are formed so as to be bent for each line in a scanning direction.

3. The liquid crystal display device according to claim 1, wherein the region of the unit pixel is formed so as to be shifted by half a width of the region of the unit pixel in a direction in which the plurality of gate lines extend, for each of the scanning lines.

4. The liquid crystal display device according to claim 1, wherein two gate lines are formed between the regions of the unit pixels, which are adjacent to each other in a direction of extension of the drain lines.

5. A display device, comprising:
a plurality of drain lines to which a video signal is input;
a plurality of gate lines to which a scanning signal is input;
a first drain line of the plurality of drain lines is adjacent to a second drain line of the plurality of drain lines; and
a first gate line of the plurality of gate lines is adjacent to a second gate line of the plurality of gate lines;
wherein a first unit pixel is constituted by a first pixel, a second pixel and a third pixel and formed so as to be surrounded by the first drain line, the second drain line, the first gate line and the second gate line;
wherein the first gate line is connected to the first pixel of the first unit pixel and the second gate line is connected to the second and third pixels of the first unit pixel, the first drain line is connected to the first and second pixels of the first unit pixel and the second drain line is connected to the third pixel of the unit pixel, and
wherein the first gate line is connected to two pixels of a second unit pixel adjacent to the first unit pixel, and the second gate line is connected to one pixel of the second unit pixel different from the two pixels of the second unit pixel.

\* \* \* \* \*